(12) United States Patent
Yagi

(10) Patent No.: US 6,366,444 B1
(45) Date of Patent: Apr. 2, 2002

(54) MULTILAYER CERAMIC ELECTRONIC PART AND CONDUCTIVE PASTE

(75) Inventor: Junichi Yagi, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/537,979

(22) Filed: Mar. 30, 2000

(30) Foreign Application Priority Data

Mar. 29, 1999 (JP) .......................................... 11-085288

(51) Int. Cl.$^7$ ................................................ H01G 4/06
(52) U.S. Cl. ............................. 361/321.2; 361/321.2; 361/321.3; 361/306.1; 361/321
(58) Field of Search .................... 361/321.1, 306.1, 361/321.2–321.3; 156/89; 216/6; 428/209, 195

(56) References Cited

U.S. PATENT DOCUMENTS

| | | | | |
|---|---|---|---|---|
| 4,795,670 A | * | 1/1989 | Nisghigaki et al. | 428/209 |
| 4,803,591 A | * | 2/1989 | Miyashita | 361/321 |
| 5,004,640 A | * | 4/1991 | Nakatani et al. | 428/195 |
| 5,405,466 A | * | 4/1995 | Naito et al. | 156/89 |
| 5,514,326 A | * | 5/1996 | Tani et al. | 419/9 |
| 5,600,533 A | * | 2/1997 | Sano et al. | 361/321.4 |

\* cited by examiner

*Primary Examiner*—Dean A. Reichard
*Assistant Examiner*—Nguyen Ha
(74) *Attorney, Agent, or Firm*—Rosenman & Colin, LLP.

(57) ABSTRACT

A multilayer ceramic electronic part includes first and second ceramic particles dispersed in internal electrodes which are interposed between ceramic layers, the first ceramic particles having an average particle diameter about or less than that of the conductive particles and second ceramic particles having such an average particle diameter that they extend both of the ceramic layers with one of the internal electrodes disposed therebetween. Further, a conductive paste for use in a multilayer ceramic electronic part includes the first ceramic powders having an average powder diameter about or less than that of the conductive particles and the second ceramic powders having a larger average powder diameter than that of the conductive particle.

13 Claims, 4 Drawing Sheets

MULTILAYER CERAMIC ELECTRONIC PART AND CONDUCTIVE PASTE

FIELD OF THE INVENTION

The present invention relates to a multilayer ceramic electronic part incorporating therein a laminated structure composed of internal electrodes and ceramic layers, and external electrodes electrically connected to the internal electrodes; and, more particularly, to a multilayer ceramic electronic part which can be mounted on a circuit board and soldered thereon without causing cracks to be formed inside the laminated structure or the laminated structure to delaminate.

BACKGROUND OF THE INVENTION

The multilayer electronic part can be, for example, a multilayer capacitor, a multilayer inductor, a multilayer piezoelectric part, a multilayer filter, a ceramic multilayer circuit board.

As the typical example of the multilayer electronic part, the multilayer ceramic capacitor includes a laminated structure having a plurality of ceramic layers made of a dielectric material and external electrodes, some of the ceramic layers including an internal electrode formed thereon. The ceramic layers are stacked on top of each other in such a way that the internal electrodes are alternatingly exposed at two opposing sides of the laminated structure. The external electrodes are disposed at the foregoing opposing sides of the laminated structure so as to be electrically connected to the internal electrodes of the laminated structure.

There is shown in FIG. 3 an arrangement of the foregoing laminated structure 3. The laminated structure 3 includes a plurality of ceramic layers 7, 7 . . . formed with internal electrodes 5, 6 and made of a dielectric material, and a plurality of ceramic layers 7, 7 . . . with no internal electrodes formed thereon. The ceramic layers 7, 7 with no internal electrodes formed thereon are known as dummy sheets. The ceramic layers 7, 7 are stacked in top of each other in such a way that the internal electrodes 5, 6 are alternatingly exposed at two opposing sides of the laminated structure 3. The dummy sheets are, respectively, disposed on top of an uppermost ceramic layer 7 and below an undermost ceramic layer 7. As shown in FIG. 1, at the foregoing opposing sides of the laminated structure 3 are, respectively, installed a pair of external electrodes 2, 2 so as to be electrically connected to the internal electrodes 5, 6.

Such a multilayer ceramic capacitor is not manufactured separately. To be more specific, first, a slurry is formed by blending together fine ceramic powders and an organic binder. The slurry is then thinly developed on a carrier film composed of polyethylene terephtalate film and dried thereon, thereby forming a ceramic green sheet. Next, after the ceramic green sheet is diced by a cutting head on a supporting film into a desired size, its one side is printed with a conductive paste and dried. As a result, as shown in FIG. 4, a plurality of ceramic green sheets 1a, 1b on which internal electrode patterns 2a, 2b are, respectively, formed lengthwise and crosswise are obtained.

Subsequently, after the ceramic green sheets 1a, 1b which are, respectively, formed with the internal electrode patterns 2a, 2b are stacked in top of each other, and ceramic green sheets 1, 1 which are not formed with internal electrode patterns are, respectively, stacked on top of an uppermost ceramic green sheet 1a and below a undermost ceramic green sheet 1b, they are pressed to form a laminated structure. When the ceramic green sheets 1a, 1b are stacked in top of each other, the internal electrode patterns 2a of the ceramic green sheets 1a are crossed with respect to the internal electrode patterns 2b of the ceramic green sheets 1b by a half of length of the internal electrode patterns 2b. Thereafter, the laminated structure is diced into a desired size to obtain laminated green chips. The laminated green chips are then sintered to obtain the laminated structure 3 as shown in FIG. 3.

Next, the conductive paste is applied on two opposing sides of the sintered laminated structure 3 and heated to form a pair of external electrodes 2, 2, resulting in the multilayer ceramic capacitor having a pair of external electrodes 2, 2 as shown in FIG. 1.

However, in such a laminated structure 3, an adhesion between the internal electrodes 5, 6 and the ceramic layers 7 is low compared to an adhesion between the ceramic layers 7. Particularly, at the foregoing two opposing sides of the laminated structure 3 to which the internal electrodes 5, 6 are exposed, the ceramic layers 7 get easily delaminated. Further, the fine cracks may develop inside the laminated structure 3.

Nowadays, in order to obtain a relatively large capacitance or a relatively large inductance using the laminated structure having a small size, a prevailing trend is to reduce the thickness of the internal electrodes 5, 6 or the ceramic layers 7. However, when the internal electrodes or the ceramic layers become too thin, a thermal stress generated at the internal electrodes or the ceramic layers may become too large during the soldering of external electrodes to land electrodes of the circuit, causing cracks to be formed inside the laminated structure or the laminated structure to delaminate.

SUMMARY OF THE INVENTION

It is, therefore, a primary object of the present invention to provide a multilayer ceramic electronic part having a high adhesion between ceramic layers constituting a laminated structure incorporated therein, and capable of preventing cracks from developing inside the laminated structure or the laminated structure from delaminating during the soldering of external electrodes on land electrodes of a circuit board.

In accordance with one aspect of the present invention, there is provided a multilayer ceramic electronic part incorporating therein a laminated structure having internal electrodes made of conductive particles and ceramic layers, the multilayer ceramic electronic part comprising first and second ceramic particles dispersed in the internal electrodes which are interposed between the ceramic layers, the first ceramic particles having an average particle diameter about or less than that of the conductive particle and second ceramic particles having such an average particle diameter that they extend both of the ceramic layers adjacent to each other with one of the internal electrodes disposed therebetween.

The ceramic layers are prevented from delaminated by the presence of the first ceramic particles and the second ceramic particles which function as thermal shock absorbers and anchors, respectively.

In accordance with another aspect of the present invention, there is provided a conductive paste for use in a multilayer ceramic electronic part, the conductive paste including conductive particles whose average diameter is about or greater than that of the first ceramic powders and is less than that of the second ceramic powders.

BRIEF DESCRIPTION OF THE DRAWINGS

The above and other objects and features of the present invention will become apparent from the following descrip- FIG. 1 describes a partial cutaway perspective view of a multilayer ceramic capacitor in accordance with the present invention.

DETAILED DESCRIPTION OF THE PREFERRED EMBODIMENTS

A method of forming a multilayer ceramic capacitor as an example of a multilayer ceramic electronic part will be described in detail.

First, by uniformly dispersing dielectric ceramic raw powders such as a barium titanate into an organic binder such as ethylene cellulose in a solvent, a desired ceramic slurry is formed. The ceramic slurry is thinly, uniformly applied on a base film such as polyethylene terephtalate film in a predetermined thickness and is dried, thereby forming a filmed ceramic green sheet. Thereafter, the filmed ceramic green sheet is diced into a predetermined size.

Figure 4:
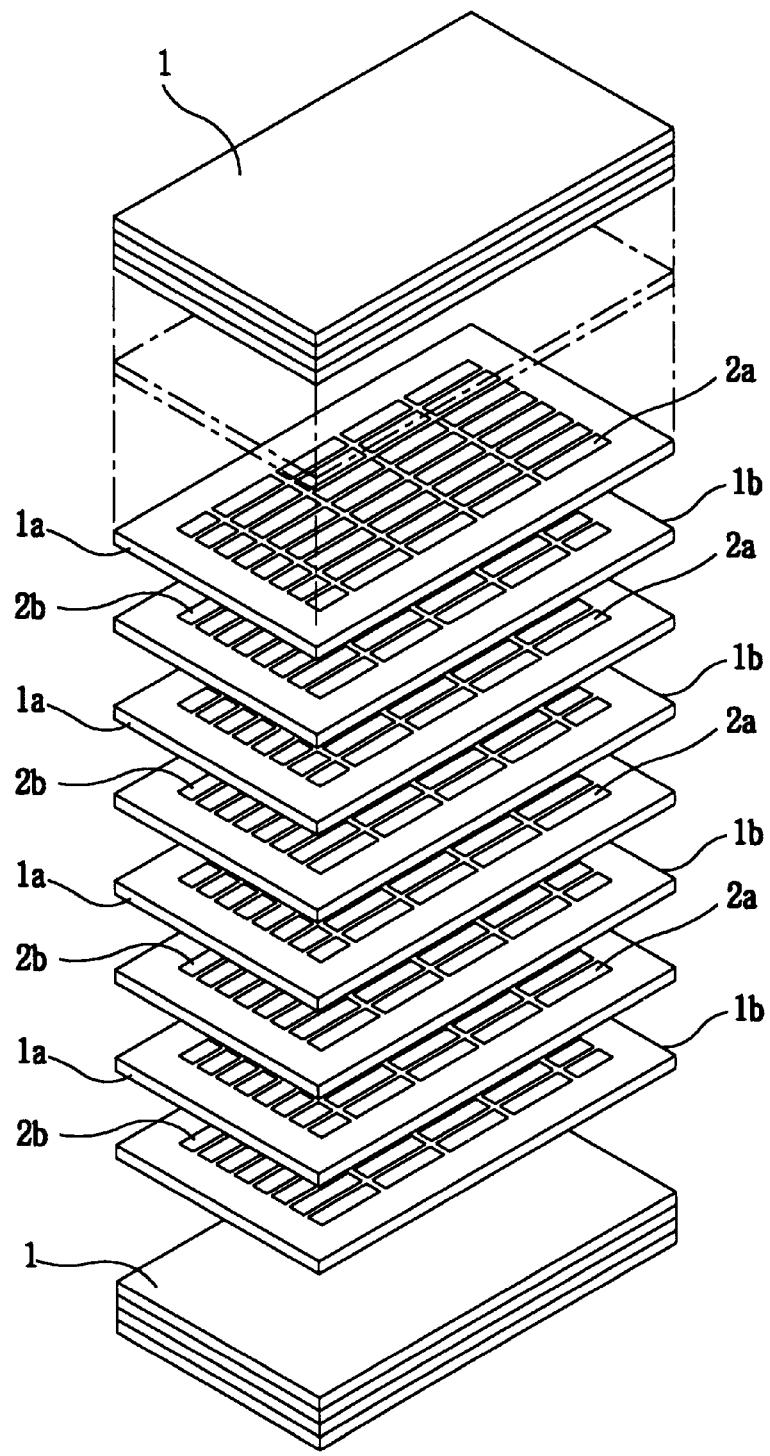
FIG. 4. offers an exploded perspective view setting forth an arrangement of ceramic green sheets for forming the inventive multilayer ceramic capacitor.

Next, as shown in FIG. 4, by using the conductive paste, two types of internal electrode patterns 2a, 2b are, respectively, printed on the diced ceramic green sheets 1a, 1b. For example, the conductive paste is formed by uniformly mixing and dispersing, in a solvent, conductive particles, a binder, first ceramic powders and second ceramic powders. To be more specific, with respect to the conductive particles selected from Ni, Cu, Ag, Pd, Ag—Pd etc. being set as 100 weight %, the binder selected from ethylcellulose, acryl, polyester etc., has 3–12 weight %, the solvent selected from butylcarbitol, butylcarbitol acetate, terpineol, ethylcellosolve, hydrocarbon etc., has 80–120 weight %, the first ceramic powders are barium titanate powders of 10–50 weight%, and the second ceramic powders are barium titanate powders of 0.01–1 weight %. Further, the barium titanate powders employed as the first ceramic powders have an average particle diameter about or less than that of the conductive particles and the barium titanate powders employed as the second ceramic powders have a larger average particle diameter than that of the conductive particles.

In particular, the first ceramic powders are the barium titanate powders having the average particle diameter which is 0.05–1 times the average particle diameter of the conductive particles, and the second ceramic powders are the barium titanate powders having the average particle diameter which is 2–10 times the average particle diameter of the conductive particles.

By using the conductive paste such as Ni paste, the internal electrode patterns 2a, 2b are, respectively, printed on the ceramic green sheets 1a, 1b.

As shown in FIG. 4, the ceramic green sheets 1a, 1b on which the internal electrode patterns 2a, 2b are printed are stacked alternatingly and then on top of an uppermost ceramic green sheet 1a and on bottom of a undermost ceramic green sheet 1b are, respectively, disposed dummy sheets, i.e., ceramic green sheets 1, 1 on which no internal electrodes are printed. Next, the stacked sheets 1, 1a, 1b are pressed to form a laminated structure. The laminated structure is diced in a vertical and a horizontal directions to form chips having a predetermined size. Thereafter, each of the chips is sintered to form a laminated structure 3 as shown in FIG. 3.

Figure 3:
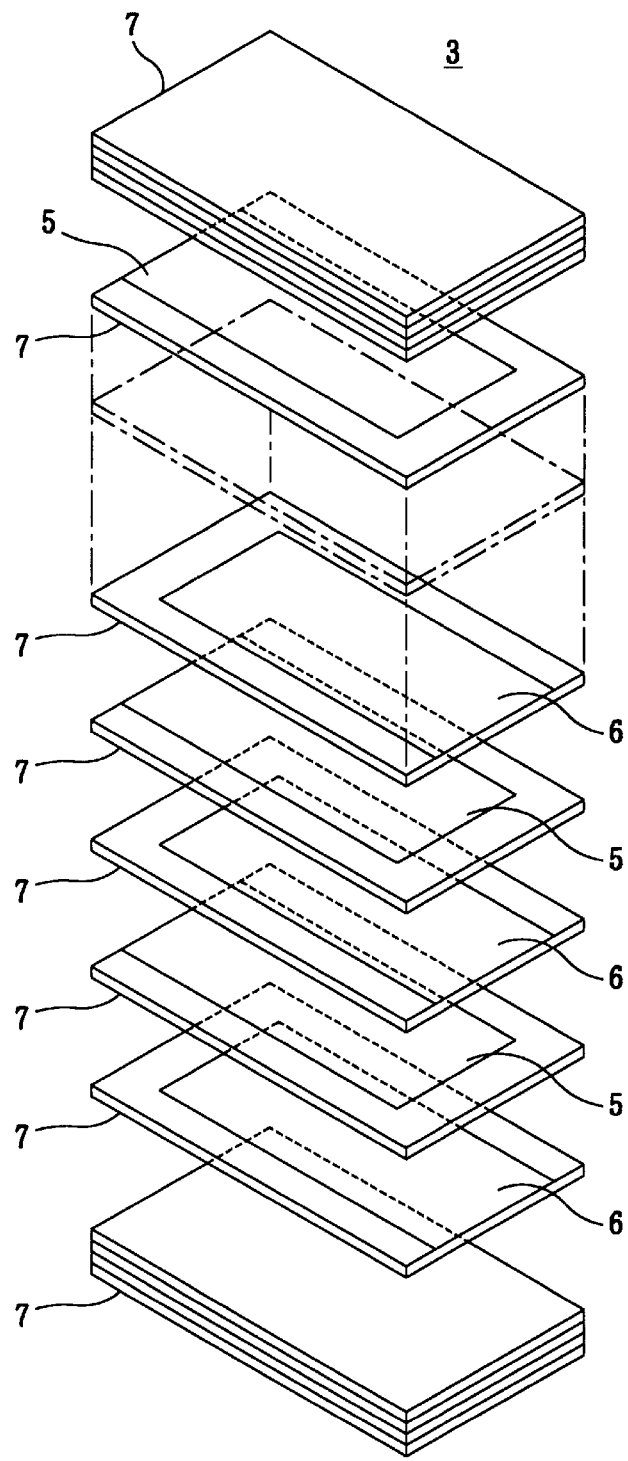
FIG. 3 illustrates an exploded perspective view of a laminated structure of the inventive multilayer ceramic capacitor.

As shown in FIG. 3, The laminated structure 3 includes a plurality of ceramic layers 7, 7 . . . formed with the internal electrodes 5, 6 and made of a dielectric material, the ceramic layers 7, 7 being stacked in top of each other, and on top of and below the stacked ceramic layers 7, 7 . . . are, respectively, disposed a plurality of ceramic layers 7, 7 . . . which are not formed with the internal electrodes. In the laminated structure 3, the internal electrodes 5, 6 which oppose each other with the ceramic layer 7 positioned therebetween are alternatingly exposed at two opposing sides of the laminated structure 3.

Figure 1:
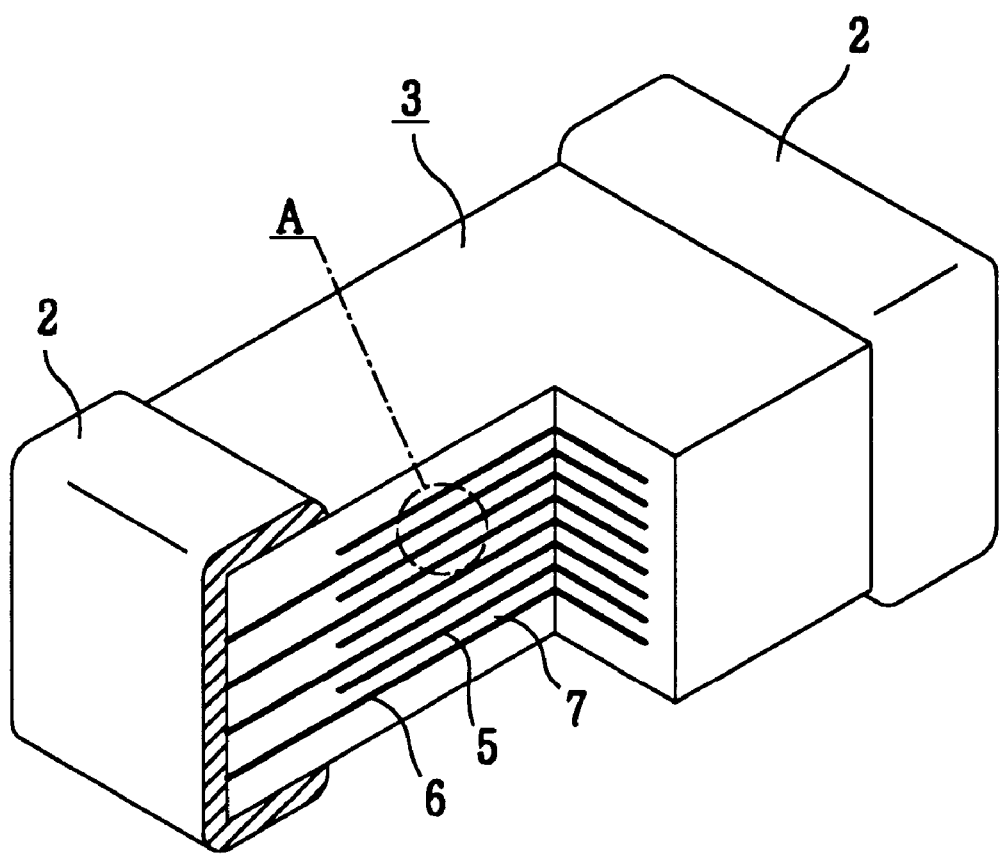

As shown in FIG. 1, the conductive paste such as Ni paste is applied on the foregoing opposing sides of the laminated structure 3, and heated and stuck to form a conductive film thereon. Further, by carrying out Ni coating and Sn coating or a soldering coating on the conductive film, a pair of external electrodes 2, 2 are formed, resulting a multilayer ceramic capacitor.

Figure 2:
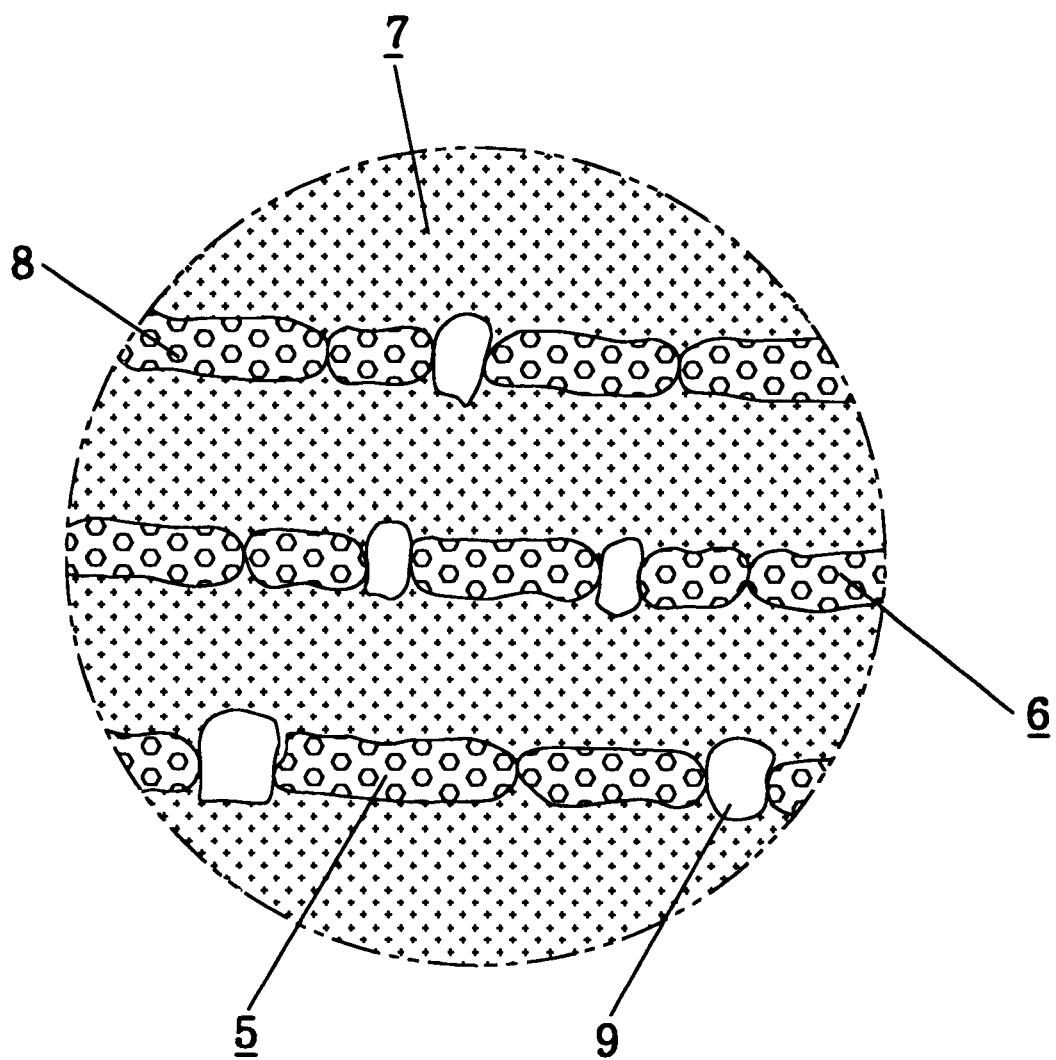
FIG. 2 shows an expanded view of "A" in FIG. 1.

During the sintering of the laminated structure 3, the internal electrode patterns 2a, 2b get also sintered, the sintered internal electrodes 5, 6 incorporating therein the conductive film composed of the conductive particles into which the foregoing first ceramic powders added are dispersed as the first ceramic particles 8 (FIG. 2). The first ceramic particles 8, function to reduce the difference in thermal expansion coefficients between the internal electrodes 5, 6 and the ceramic layers 7, 7 at both sides of the internal electrodes 5, 6. In particular, by using the first ceramic particles of an identical material to a ceramic material constituting the ceramic layer 7, it is relatively easy to reduce the difference in the thermal expansion coefficients between the internal electrodes 5, 6 and the ceramic layers 7, 7 at both sides of the internal electrodes 5, 6. As a result, it is possible to efficiently prevent cracks from developed inside the laminated structure 3 due to a thermal shock.

On the other hand, the second ceramic powders added into the conductive paste are dispersed between the conductive films incorporated in the internal electrodes 5, 6 as the second ceramic particles 9 (FIG. 2). The ceramic particles 9 have such a size that they extend both of the ceramic layers 7 adjacent to each other with one of the internal electrodes 5, 6 disposed therebetween.

The ceramic particles 9 act as an anchor for partially fastening the ceramic layers 7, 7 having the internal electrode 5 or 6 disposed therebetween. In particular, by making the ceramic particle 9 of an identical material to a ceramic material constituting the ceramic layer 7, the anchoring efficiency is increased, thereby preventing the ceramic layers 7, 7 from being delaminated.

There is shown in FIG. 2 a partial cross sectional view of a ceramic layer 7 exposed by burying the multilayer ceramic capacitor in an acryl based resin and polishing it in a direction perpendicular to a direction in which the ceramic layers 7 are stacked. That is, FIG. 2 shows an expanded view of "A" in FIG. 1.

As shown in FIG. 2, between the ceramic layers 7, 7 are disposed a series of flat conductive particles in a boundary direction of the ceramic layer 7, thereby forming the internal electrodes 5, 6. Among the conductive particles constituting the internal electrodes 5, 6 are dispersed the ceramic particles 9 having a larger particle diameter than the thickness of the internal electrode 5 or 6. In the pair of ceramic layers 7, 7 with the internal electrode 5 or 6 disposed therebetween, the ceramic particles 9 have such a size that they extend both of the foregoing ceramic layers 7, 7. These ceramic particles 9 function to partially fasten together the foregoing ceramic layers 7, 7.

The embodiments in accordance with the present invention are compared with the prior arts embodiment will be described hereinafter.

By uniformly dispersing dielectric ceramic green powders such as barium titanate into an organic binder such as ethylene cellulose in solvent, a ceramic slurry is formed. The ceramic slurry is thinly, uniformly applied on a base film such as polyethylene terephtalate film in a predetermined thickness and is dried, thereby forming a filmed ceramic green sheet. Next, after the filmed ceramic green sheet is delaminated from the base film, it is diced into 150 mm×150 mm ceramic green sheets.

On the other hand, the conductive paste is formed by uniformly mixing and dispersing, in a solvent, conductive particles, first ceramic powders and second ceramic powders. To be more specific, with respect to 100 weight % of Ni powders having an average particle diameter of 0.5 μm, 8 weight % ethylcellulose as the binder, 30 weight % barium titanate powders having an average particle diameter of 0.1 μm as the first ceramic powder, and 0.5 weight % barium titanate powders having an average particle diameter of 3 μm are mixed and dispersed in 100 weight % solvent to form the conductive paste. As shown in FIG. 4, with the Ni conductive paste, the internal electrode patterns 2a, 2b having an average thickness of about 2.5 μm are, respectively, formed on the ceramic green sheets using a screen printer.

The ceramic green sheets 1a, 1b on which the internal electrode patterns 2a, 2b are printed are stacked alternatingly and then on top of an uppermost ceramic green sheet and on bottom of a undermost ceramic green sheet are, respectively, disposed dummy sheets, i.e. ceramic green sheets 1, 1 on which no internal electrode patterns are printed. Thereafter, the stacked sheets 1, 1a, 1b are pressed in their stacked direction under 120° C. temperature at 200t pressure, thereby forming a laminated structure.

The laminated structure is diced into 5.3 mm×5.0 mm and sintered at 1320° C., thereby forming a sintered laminated structure 3 as shown in FIG. 3. Further, Ni paste is applied on the opposing sides of the sintered laminated structure 3, and heated to be stuck thereon. Subsequently, after the chip is put into the electrolysis barrel to be Ni plated, soldering coating is carried out to form a pair of external electrodes 2, 2 thereon, resulting in a multilayer ceramic capacitor as shown in FIG. 1.

After burying a hundred of the multilayer ceramic capacitors in an acryl based resin and polishing them in a direction perpendicular to a direction in which the internal electrode patterns 5, 6 are stacked, the internal electrode patterns 5, 6 and the ceramic layers 7 are observed using an optical microscope. As a result, as shown in FIG. 2, between the ceramic layers 7, 7 are disposed a series of flat conductive particles in a boundary direction of any one ceramic layer 7, forming the internal electrodes 5, 6. Further, among the internal electrodes 5, 6 are dispersed the ceramic particles 9. The ceramic particles 9 have a larger particle diameter than the thickness of the internal electrode 5 or 6 and extend both of the foregoing ceramic layers 7, 7 with one of the internal electrodes 5, 6 disposed therebetween.

Moreover, in those hundred laminated ceramic capacitors, no cracks or delamination were observed when inspected for the presence of cracks or delamination. Further, no cracks or delamination were observed after these hundred laminated ceramic capacitor were soldered to landing electrodes on the circuit board through the corresponding external electrodes 2, 2. This result is obtained for an embodiment 1 in table 1.

Further, the multilayer ceramic capacitor manufacturing methods in accordance with embodiments 2 to 9 of table 1 are identical to that of the embodiment 1 except for employing a conductive paste into which the first and the second ceramic powders listed in the embodiments 2 to 9 of table 1 are added. For the laminated structure 3 before and after being soldered through the corresponding external electrodes, identical results were obtained. These results are shown as embodiments 2 to 9 in table 1.

TABLE 1

|  | First ceramic powder | | Second ceramic powder | | | |
| --- | --- | --- | --- | --- | --- | --- |
|  | Average particle diameter (μm) | Wt % of Ni | Average particle diameter (μm) | Wt % of Ni | Frequency (among 100 numbers) | Capacitance |
| Embodiment 1 | 0.1 | 30 | 3 | 0.5 | 0 | ○ |
| Embodiment 2 | 0.025 | 30 | 3 | 0.5 | 0 | ○ |
| Embodiment 3 | 0.1 | 30 | 1 | 0.5 | 0 | ○ |
| Embodiment 4 | 0.5 | 30 | 3 | 0.5 | 0 | ○ |
| Embodiment 5 | 0.1 | 30 | 5 | 0.5 | 0 | ○ |
| Embodiment 6 | 0.1 | 10 | 3 | 0.5 | 0 | ○ |
| Embodiment 7 | 0.1 | 30 | 3 | 0.01 | 0 | ○ |
| Embodiment 8 | 0.1 | 50 | 3 | 0.5 | 0 | ○ |
| Embodiment 9 | 0.1 | 30 | 3 | 1 | 0 | ○ |
| Comparative example 1 | 0.02 | 30 | 3 | 0.5 | 2 | ○ |
| Comparative example 2 | 0.1 | 30 | 0.9 | 0.5 | 4 | ○ |
| Comparative example 3 | 0.6 | 30 | 3 | 0.5 | 7 | ○ |
| Comparative example 4 | 0.1 | 30 | 5.5 | 0.5 | 0 | x |

TABLE 1-continued

|  | First ceramic powder | | Second ceramic powder | | | |
|---|---|---|---|---|---|---|
|  | Average particle diameter (μm) | Wt % of Ni | Average particle diameter (μm) | Wt % of Ni | Frequency (among 100 numbers) | Capacitance |
| Comparative example 5 | 0.1 | 9 | 3 | 0.5 | 4 | ○ |
| Comparative example 6 | 0.1 | 30 | 3 | 0.005 | 6 | ○ |
| Comparative example 7 | 0.1 | 55 | 3 | 0.5 | 0 | x |
| Comparative example 8 | 0.1 | 30 | 3 | 1.5 | 0 | x |
| Comparative example 9 | 0.1 | 30 | — | — | 8 | ○ |

The ceramic capacitor manufacturing methods in accordance with comparative examples 1 to 8 of table 1 are identical to that of the embodiment 1 except for employing conductive paste into which the first and the second ceramic powders shown in the comparative examples 1 to 8 of table 1 are added. Further, the multilayer ceramic capacitor manufacturing method in accordance with a comparative example 9 of table 1 is identical to that of the embodiment 1 except for employing a conductive paste into which only the first ceramic powders shown in the comparative example 9 in table 1 are added.

In the comparative examples 1 to 3, 5, 6, 9, cracks and delamination were observed prior to and after the soldering of the external electrodes. On the other hand, in the comparative examples 4, 7, 8, although the cracks and the delamination were not observed, there were electrically useless for their capacitances were too small to be practical.

The above-mentioned results can be attributed to the following. In the comparative example 1, the average particle diameter of the first ceramic powders was 0.02 μm which is too small, i.e., 0.04 times the average particle diameter of Ni powder particles of the conductive paste which was 0.5 μm. In contrast to this, in the comparative example 3, the average particle diameter of the first ceramic powders was 0.6 μm which is too large, i.e., 1.2 times the average particle diameter of Ni powder particles of the conductive paste which was 0.5 μm.

In the comparative example 2, the average particle diameter of the second ceramic powders was 0.9 μm which is too small, i.e., 1.8 times the average particle diameter of Ni powder particles of the conductive paste which was 0.5 μm. In contrast to this, in the comparative example 4, the average particle diameter of the second ceramic powders was 5.5 μm which is too large, i.e., 11 times the average particle diameter of Ni powder particles of the conductive paste which was 0.5 μm.

In the comparative example 5, with respect to 100 weight % Ni powder, amount of the first ceramic powders added was 9 weight % which is too small. In contrast to this, in the comparative example 7, with respect to 100 weight % Ni powder, amount of the first ceramic powder added was 55 weight % which was too large.

In the comparative example 6, with respect to 100 weight % Ni powder, amount of the second ceramic powders added was 0.005 weight % which is too small. In contrast to this, in the comparative example 8, with respect to 100 weight % Ni powder, amount of the second ceramic powder added was 1.5 weight % which was too large.

Further, in the laminated structure 3 of the multilayer ceramic capacitor in accordance with the comparative example 9, cracks are developed 8 times out of 100.

Although the above discussions were presented referring to a situation where the multilayer ceramic capacitor is described as the multilayer electronic part, a multilayer ceramic inductor, a multilayer ceramic LC composite part, a ceramic multilayer circuit board etc., may be described as the inventive multilayer electronic part.

As described above, the difference in the thermal expansion coefficients between the ceramic layers constituting the laminated structure of the multilayer ceramic electronic part decreases and the fastening force therebetween increases. Accordingly, the laminated structure has a relatively high resistance against the thermal shock generated when the multilayer ceramic electronic part is mounted on the circuit board and the external electrodes are soldered, making it possible to obtain the multilayer ceramic electronic part does not allow cracks to be developed inside the laminated structure or the laminated structure to delaminate.

What is claimed is:

1. A multilayer ceramic electronic part incorporating therein a laminated structure in which ceramic layers and internal electrodes are stacked alternatingly and a pair of external electrodes disposed at opposing sides of the laminated structure, the internal electrodes being exposed at the opposing sides of the laminated structure and the external electrodes being electrically connected to the exposed internal electrodes, the multilayer ceramic electronic part further comprising:

first ceramic particles disposed at the internal electrodes which are made of conductive particles and interposed between the ceramic layers, the first ceramic particles having an average particle diameter about or less than that of the conductive particles; and second ceramic particles disposed at the internal electrodes, the second ceramic particles having an average particle diameter greater than that of the conductive particles and a second ceramic particles disposed at each internal electrode between two neighboring ceramic layers of said each internal electrode.

2. The multilayer ceramic electronic part of claim 1, wherein the first and the second ceramic particles are made of an identical material to a ceramic material constituting the ceramic layers.

3. The multilayer ceramic electronic part of claim 1 or 2, wherein the first ceramic particles have the average particle diameter which is 0.05–1 times that of the conductive particles constituting the internal electrodes.

4. The multilayer ceramic electronic part of claim 1 or 2, wherein the average particle diameter of the second ceramic particles is greater than the average thickness of the internal electrodes.

5. The multilayer ceramic electronic part of claim 1 or 2, wherein the average particle diameter of the second ceramic particles is 2–10 times that of the conductive particle constituting the internal electrodes.

6. A conductive paste for use in forming an internal electrode in a multilayer ceramic electronic part, the ceramic electronic part including a plurality of laminated ceramic layers, the conductive paste comprising:

conductive particles;

first ceramic powders having an average particle diameter about or less than that of the conductive particles;

second ceramic powders having an average particle diameter larger than that of the conductive particles; and a binder, wherein the conductive particles, the first ceramic powders, the second ceramic powders, and the binder are dispersed in a solvent.

7. The conductive paste of claim 6, wherein the first and the second ceramic powders are made of an identical material to a ceramic material constituting the ceramic layers.

8. The conductive paste of claim 6 or 7, wherein the first ceramic powders have the average particle diameter which is 0.05–1 times that of the conductive particles.

9. The conductive paste of claim 6 or 7, wherein amount of the first ceramic powders added is 10–50 weight % of that of the conductive particles added.

10. The conductive paste of claim 6 or 7, wherein the average particle diameter of the second ceramic powders is 2–10 times that of the conductive particles.

11. The conductive paste of any one of claim 6 or 7, wherein amount of the second ceramic powders added is 0.01–1 weight % that of the conductive particles added.

12. The multilayer ceramic electronic past of claim 1, wherein the first ceramic particles reduce the difference in the thermal expansion coefficients between the internal electrodes and the ceramic layers and the second ceramic particles disposed at each internal electrode partially fasten the two neighboring ceramic layers.

13. A conductive paste for use in forming internal electrodes in a multilayer ceramic electronic part, the ceramic electronic part including a plurality of ceramic layers, and the ceramic layers and the internal electrodes being stacked alternating, the conductive paste comprising:

conductive particles;

first ceramic powders for reducing the difference in the thermal expansion coefficients between the internal electrodes and the ceramic layers, the first ceramic powers having an average particle diameter about or less than that of the conductive particles;

second ceramic powders for partially fastening two neighboring ceramic layers of each internal electrode, the second ceramic powders having an average particle diameter larger than that of the conductive particles;

a binder; and a solvent, wherein the conductive particles, the first ceramic powders, the second ceramic powders, and the binder are dispersed in the solvent.

* * * * *

UNITED STATES PATENT AND TRADEMARK OFFICE
CERTIFICATE OF CORRECTION

PATENT NO.     : 6,366,444 B1
DATED          : April 2, 2002
INVENTOR(S)    : Junichi Yagi It is certified that error appears in the above-identified patent and that said Letters Patent is hereby corrected as shown below:

<u>Title page,</u>
Item [22], please correct the filing date from "March 30, 2000" to
-- March 29, 2000 --.

Signed and Sealed this

Fifteenth Day of April, 2003

JAMES E. ROGAN
*Director of the United States Patent and Trademark Office*